(12) United States Patent
Konecny et al.

(10) Patent No.: US 8,803,360 B2
(45) Date of Patent: Aug. 12, 2014

(54) BOOT-STRAP REGULATOR FOR GATE DRIVER

(75) Inventors: Pavel Konecny, San Jose, CA (US); Jinwen Xiao, Los Altos, CA (US)

(73) Assignee: Silicon Laboratories Inc., Austin, TX (US)

( * ) Notice: Subject to any disclaimer, the term of this patent is extended or adjusted under 35 U.S.C. 154(b) by 689 days.

(21) Appl. No.: 13/076,333

(22) Filed: Mar. 30, 2011

(65) Prior Publication Data

US 2012/0249099 A1    Oct. 4, 2012

(51) Int. Cl.
*H02J 1/10* (2006.01)

(52) U.S. Cl.
USPC .......................................................... 307/43

(58) Field of Classification Search
USPC .......................................................... 307/43
See application file for complete search history.

(56) References Cited

U.S. PATENT DOCUMENTS

| 7,646,185 B2 * | 1/2010 | Kim .............................. 323/283 |
| 2006/0250188 A1 * | 11/2006 | Kaya ............................ 330/277 |
| 2009/0322299 A1 * | 12/2009 | Michishita et al. ........... 323/282 |
| 2010/0013555 A1 * | 1/2010 | Berkhout ....................... 330/251 |
| 2010/0123442 A1 * | 5/2010 | Peterson et al. .............. 323/282 |

OTHER PUBLICATIONS

"MP8042 High Current, Dual Channel Power Half-Bridge," MPS The Future of Analog IC Technology: Initial Release—Specifications Subject to Change, MP8042 Rev. 0.9, May 23, 2006, 9 pages.
"20-W Stereo Digital Audio Power Amplifier with EQ and DRC," Texas Instruments Incorporated: TAS5709, TAS5709A, SLOS599A—Nov. 2008—revised Sep. 2009, 59 pages.

* cited by examiner

*Primary Examiner* — Jared Fureman
*Assistant Examiner* — Duc M Pham
(74) *Attorney, Agent, or Firm* — Meyertons, Hood, Kivlin, Kowert & Goetzel, P.C.; Paul T. Seegers (57) ABSTRACT

Techniques are disclosed relating to supplying a power supply voltage to a gate driver. In one embodiment, an apparatus is disclosed that includes a first transistor configured to raise a voltage at a node and a second transistor configured to lower the voltage at the node. The apparatus further includes a first driver configured to receive a first power supply voltage, and to use the first power supply voltage to control a gate voltage of the first transistor. The apparatus further includes a second driver configured to receive a second power supply voltage, and to use the second power supply voltage to control a gate voltage of the second transistor. In such an embodiment, the apparatus includes a first regulator coupled to the first driver and configured to generate the first power supply voltage based on the second power supply voltage.

20 Claims, 5 Drawing Sheets

BOOT-STRAP REGULATOR FOR GATE DRIVER

BACKGROUND

1. Technical Field

This disclosure relates generally to circuits, and, more specifically, to gate drivers.

2. Description of the Related Art

Gate drivers are used in a variety of circuits to control the operation of transistors by raising and lowering gate voltages. Such circuits may include amplifier circuits (e.g., Class-D amplifiers), DC-to-DC converters (e.g., buck converters), etc. Gate drivers may use a power supply voltage to facilitate the raising and lowering of gate voltages. Fluctuations in power supply voltages can introduce noise that impedes circuit performance.

SUMMARY

The present disclosure describes systems and methods for supplying a power supply voltage to a gate driver.

In one embodiment, an apparatus is disclosed. The apparatus includes a first transistor configured to raise a voltage at a node and a second transistor configured to lower the voltage at the node. The apparatus further includes a first driver configured to receive a first power supply voltage, and to use the first power supply voltage to control a gate voltage of the first transistor. The apparatus further includes a second driver configured to receive a second power supply voltage, and to use the second power supply voltage to control a gate voltage of the second transistor. The apparatus further includes a first regulator coupled to the first driver. The first regulator is configured to generate the first power supply voltage based on the second power supply voltage.

In another embodiment, an apparatus is disclosed that includes high-side and low-side gate drivers configured to control a voltage at a first node. The apparatus further includes a low-side regulator configured to generate a first power supply voltage usable by the low-side gate driver. The apparatus further includes a high-side regulator coupled to the low-side regulator. The high-side regulator is configured to generate a second power supply voltage usable by the high-side driver based on the first power supply voltage.

In yet another embodiment, a method is disclosed. The method includes a circuit generating a first power supply voltage for a first driver coupled to a gate of a first transistor. The method further includes the circuit generating a second power supply voltage for a second driver coupled to a gate of a second transistor. In such an embodiment, the second power supply voltage is generated based on the first power supply voltage. The method further includes the circuit using the first and second transistors to control a voltage at an output node.

DETAILED DESCRIPTION

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue.

"First," "Second," etc. As used herein, these terms are used as labels for nouns that they precede, and do not imply any type of ordering (e.g., spatial, temporal, logical, etc.). For example, in a processor having eight processing elements or cores, the terms "first" and "second" processing elements can be used to refer to any two of the eight processing elements. In other words, the "first" and "second" processing elements are not limited to logical processing elements 0 and 1.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The present disclosure describes a regulator that is configured to provide a power supply voltage to a gate driver. As will be described below, in various embodiments, a circuit may include high-side and low-side gate drivers configured to raise and lower a voltage at an output node by controlling high-side and low-side transistors. To power the high-side and low-side drivers, the circuit may include high-side and low-side regulators that generate respective power supply voltages for the drivers.

In one embodiment, the regulator described herein is configured to generate a power supply voltage for the high-side gate driver. The generated power supply voltage may track a power supply voltage being provided to the low-side gate driver. To generate this power supply voltage, the regulator, in one embodiment, converts the power supply voltage being provided to the high-side driver to a current, and converts the power supply voltage being provided to the low-side driver to another current. The regulator then adjusts the power supply voltage being provided to the high-side driver based on a comparison of the currents.

Embodiments of the regulator described herein may have several advantages over traditional boot-strap regulators. In some instances, the regulator may be more robust to high-frequency power supply noise caused by a fast di/dt during charging of a bypass capacitor and by fast dv/dt switching at a PWM output node. The regulator may also occupy a smaller silicon area than other regulators. In some embodiments, the regulator may be used without a start-up circuit.

Figure 1A:
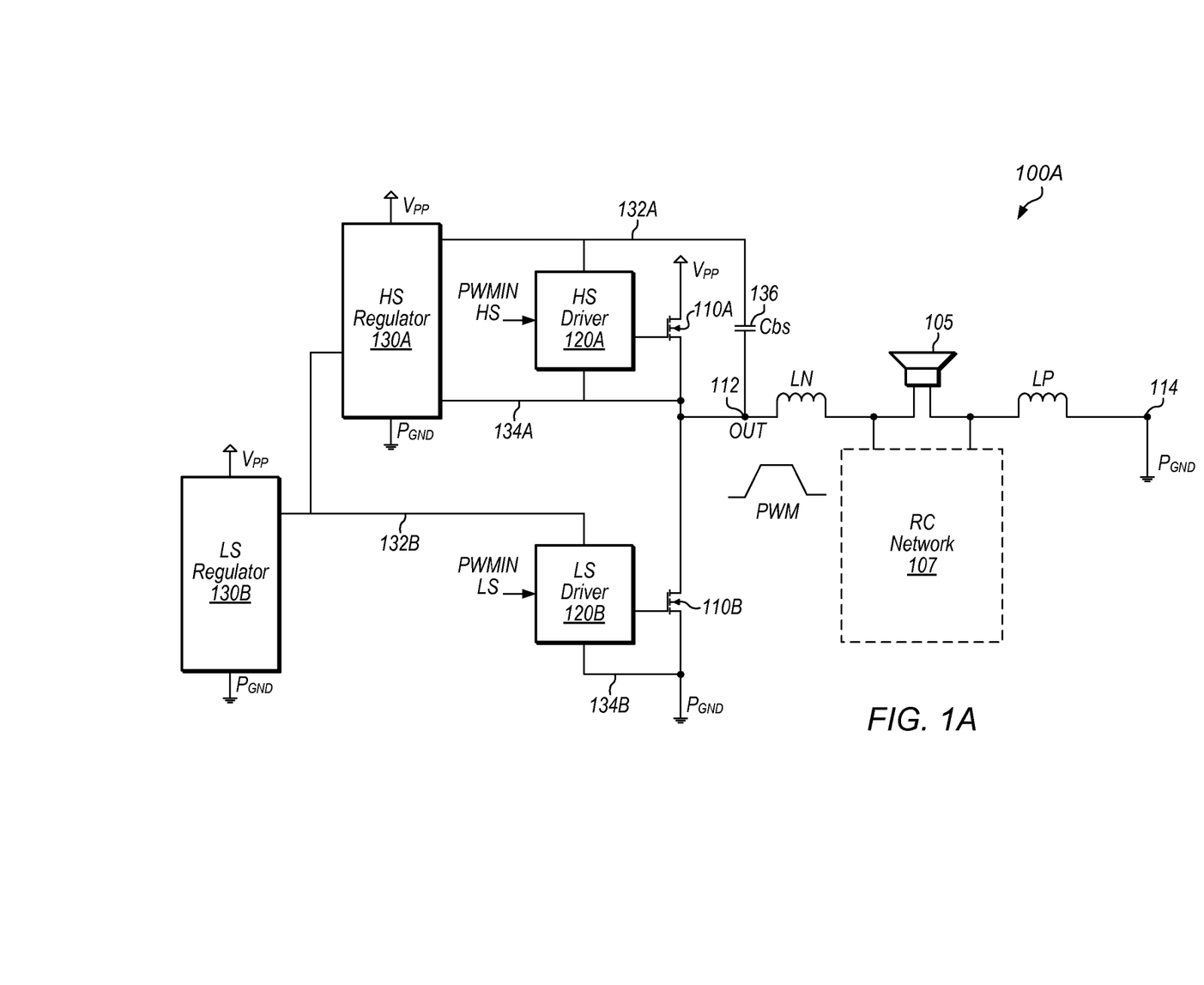
FIG. 1A is a block diagram illustrating one embodiment of a circuit that includes gate drivers and voltage regulators.

Turning now to FIG. 1, a block diagram of a circuit 100A is depicted. Circuit 100A is one embodiment of a circuit that includes gate drivers and voltage regulators. Circuit 100A may be any suitable type of circuit. In the illustrated embodiment, circuit 100A is configured as a class D amplifier (also referred to as a "digital amplifier" or a "switching amplifier"). In another embodiment, circuit 100A may be configured as a buck DC-DC converter. In yet another embodiment, circuit 100A may be configured as a light-emitting-diode (LED) driver.

In the illustrated embodiment, circuit 100A includes transistors 110A and 110B, high-side (HS) and low-side (LS) drivers 120A and 120B, and HS regulator 130A. In some embodiments, circuit 100A may further include device 105, RC network 107, and inductors LN and LP, LS regulator 130B, and/or capacitor 136. As shown, transistor 110A is coupled to HS Driver 120A, voltage source $V_{PP}$, and output node 112. Transistor 110B is coupled to LS driver 120B, ground $P_{GND}$, and output node 112. HS driver 120A is coupled to HS regulator 130A and capacitor 136 (shown as capacitor Cbs) via power rails 132A and 134A. LS driver 120B is coupled to LS regulator 130B via power rail 132B. Regulators 130 are coupled to respective voltage sources $V_{PP}$ and grounds $P_{GND}$. In some embodiments, circuit 100A is coupled to a device 105 via an output node 112. Device 105, in turn, is coupled to inductors LN and LP, a resistor-capacitor (RC) network 107, and a ground $P_{GND}$ via node 114.

Device 105 may be any suitable device, which uses a regulated power supply. In the illustrated embodiment, device 105 is depicted as a speaker. In another embodiment, device 105 may be a light source such as an LED. In some embodiments, device 105 may be an antenna for transmitting signals. Accordingly, device 105 may be coupled to output node 112 in a different manner than shown—e.g., inductors LN and LP and RC network 107 may (or may not) be present in various embodiments.

Transistors 110, in one embodiment, are configured to generate an amplified output signal at node 112 based on an input signal by coupling node 112 to voltage source $V_{pp}$ or ground $P_{GND}$. In one embodiment, transistors 110 may be N-type metal-oxide-silicon field-effect transistors (MOSFETs). In some embodiments, the output signal produced by transistors 110 may be a series of amplified pulses generated from a series of input pulses received by drivers 120. For example, in some embodiments, circuit 110A may be configured to support pulse width modulation (PWM) or pulse density modulation (PDM). To generate a pulse, transistor 110B, in one embodiment, initially lowers the voltage at node 112 by coupling it to ground $P_{GND}$ (i.e., transistor 110B is turned ON while transistor 110A is turned OFF). Transistor 120A may then raise the voltage at node 112 by coupling it to $V_{PP}$ (i.e., transistor 110A is turned ON while transistor 110B is turned OFF). Finally, transistor 120B may then lower the voltage at node 112 by again coupling it to ground $P_{GND}$.

Drivers 120A and 120B, in one embodiment, are configured to receive input signals PWMIN HS and PWMIN LS, respectively, and to control transistors 110 to generate a corresponding output signal at output node 112. To a control transistor 110, a driver 120, in one embodiment, is configured to charge and discharge a gate of that transistor 110 by using a power supply voltage supplied from a regulator 130.

Regulators 130, in one embodiment, are configured to provide respective power supply voltages to drivers 120. In the illustrated embodiment, HS driver 120A is configured to receive a power supply voltage from HS regulator 130A, where the power supply voltage for driver 120A is the voltage difference between rails 132A and 134A. LS driver 120B is configured to receive a power supply voltage from LS regulator 130B, where the power supply voltage for driver 120B is the voltage difference between rails 132B and 134B. In various embodiments, HS regulator 130A is configured to provide a power supply voltage that tracks the power supply voltage being provided to LS driver 120B. That is, if the voltage difference between power rails 132B and 134B (i.e., the voltage at node 132B—the voltage at node 134B) changes, regulator 130A may be configured to cause the voltage difference between rails 132A and 132B to have a corresponding change so that the voltage difference are similar.

In various embodiments, regulator 130A is configured to generate a power supply voltage from the power supply voltage provided to LS driver 120B. As will be described below, in one embodiment, regulator 130A is configured to compare the voltage difference between rails 132A and 134A with the voltage difference between rails 132B and 134B by generating currents from the power supply voltages and performing a comparison using the currents. If regulator 130A determines that the voltage difference between rails 132B and 134B is greater than the voltage difference between rails 132A and 134A, regulator 130A, in one embodiment, is configured to charge bypass capacitor 136 to increase the voltage difference between rails 132A and 134A. If regulator 130A determines that the voltage difference between rails 132B and 134B is less than the voltage difference between rails 132A and 134A, regulator 130A, in one embodiment, is configured to allow capacitor 136 to be discharged to reduce the voltage difference between rails 132A and 134B. In some embodiments, regulator 130A is configured to charge capacitor 136 when transistor 110B is ON (i.e., its gate voltage is a above its threshold voltage) and the voltage at node 112 is low, but not when transistor 110B is OFF (i.e., its gate voltages is below its threshold voltage) and the voltage at node 112 is high. Regulator 130A is described in further detail below in conjunction with FIGS. 2 and 3.

Figure 1B:
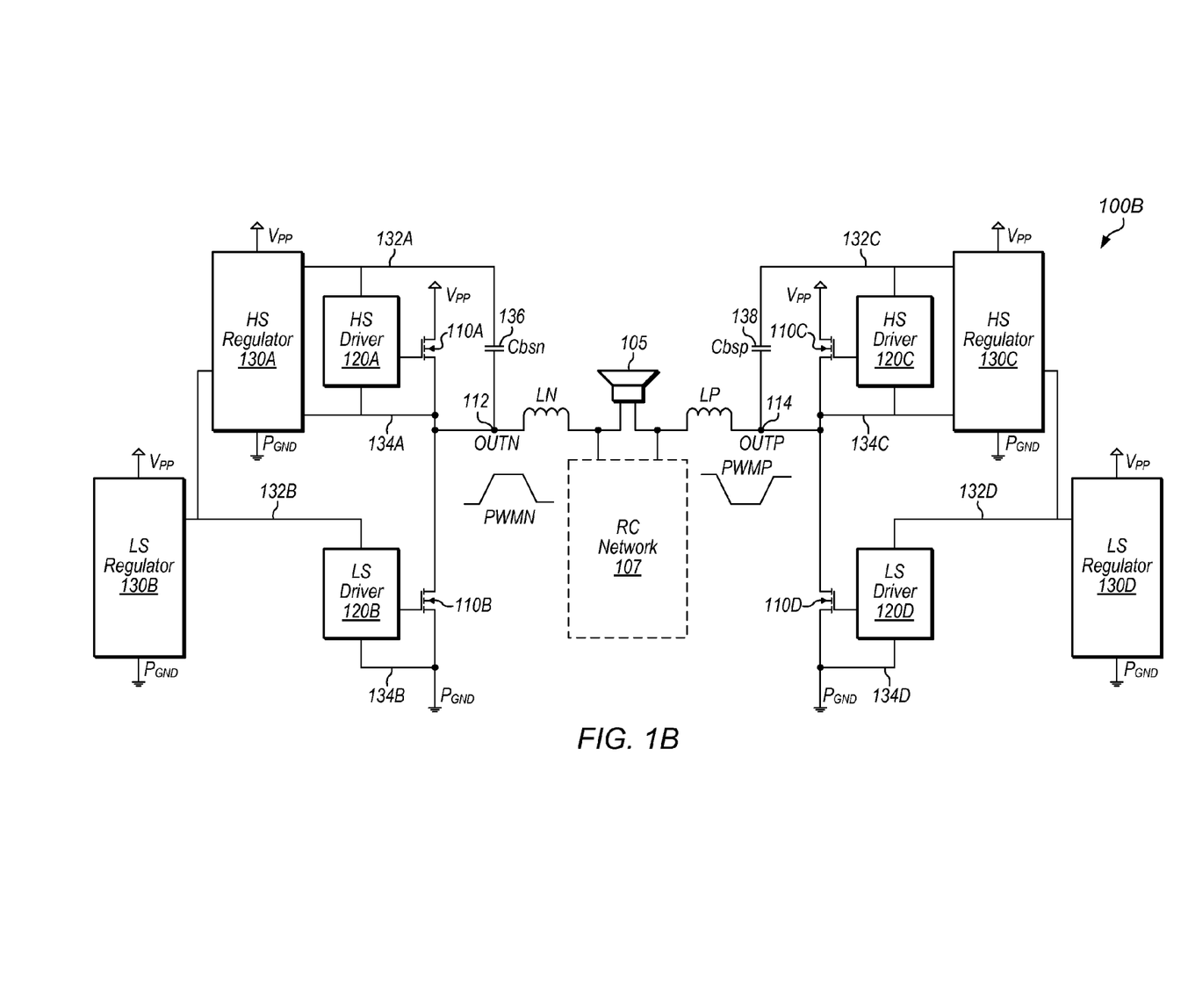
FIG. 1B is a block diagram illustrating another embodiment of a circuit that includes gate drivers and voltage regulators.

Turning now to FIG. 1B, a block diagram of another circuit 100B is depicted. Circuit 100B is another embodiment of a circuit that includes gate drivers and voltage regulators. In the illustrated embodiment, circuit 100B includes a set of transistors 110A-D, which are arranged in an H-bridge configuration. Each transistor 110 is coupled to a respective driver 120, which is coupled to a respective regulator 130. In various embodiments, the right side of the H-bridge (e.g., transistors 110C and 110D, drivers 120C and 120D, regulators 130C and 130D, capacitor 138) may function in a similar manner as the left side of the H-bridge (e.g., transistors 110A and 110B, drivers 120A and 120B, regulators 130A and 130B, capacitor 136) such as described above. In some embodiments, HS regulators 130A and 130C may be the same regulator—i.e., regulator 130A may generate the power supply voltages for both drivers 120A and 120C. Similarly, LS regulators 130B and 130D may be the same regulator In the illustrated embodiment, circuit 100B is configured to generate a differential output signal at nodes 112 and 114. As discussed above, in some embodiments, the output signal may be a series of pulses generated from an input. In one embodiment, low-side (LS) driver 120A and high side (HS) driver 120B handle generation of the lower portion (e.g., the negative portion) of the differential output signal, and LS driver 120C and HS driver 120D handle generation of the higher portion (e.g., the positive portion) of the differential output signal. In various embodiments, the actions performed by high-side and low-side drivers 120 for a PWM falling edge may be identical to those performed during a PWM rising edge, but the actions of high-side and low-side drivers 120 are swapped.

Figure 2:
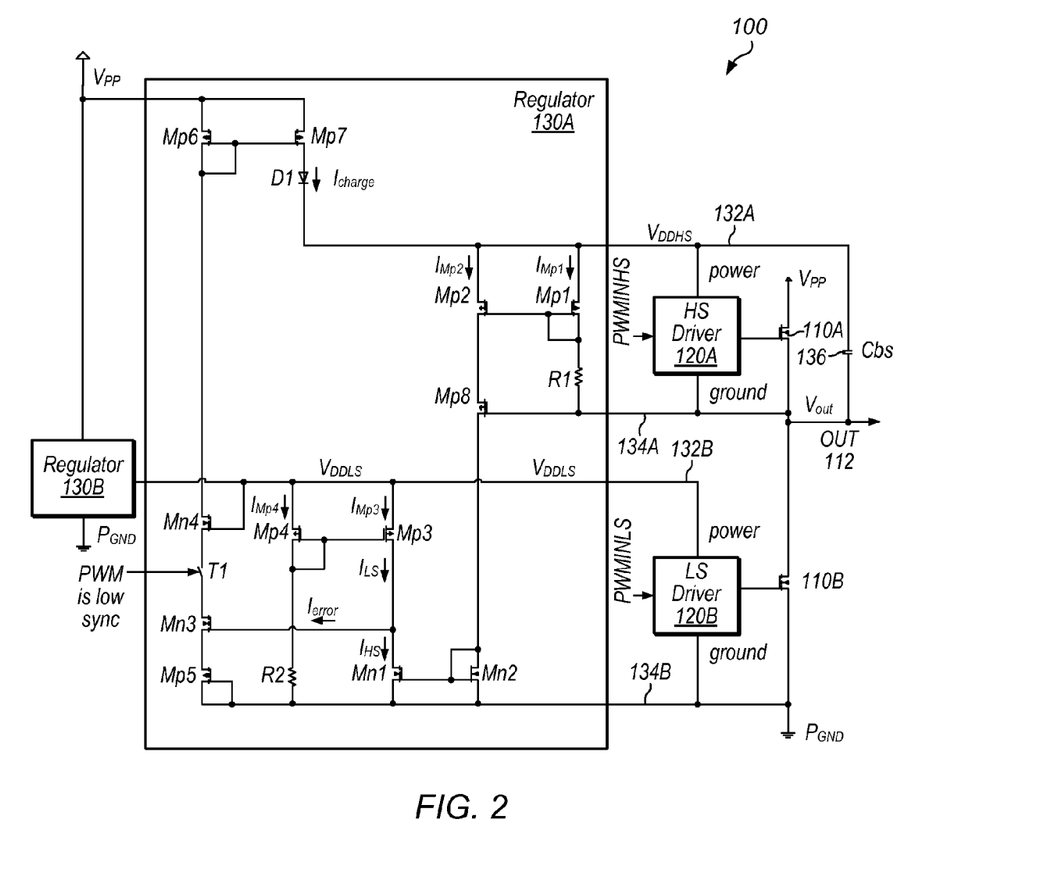
FIG. 2 is a block diagram illustrating one embodiment of a regulator that provides a power supply voltage to a gate driver.

Turning now to FIG. 2, a block diagram of one embodiment of regulator 130A is depicted. In the illustrated embodiment, regulator 130A includes resistors R1 and R2 and transistors Mn1-4 and Mp1-8. (In some embodiments, transistors Mn1-4 are N-type MOSFETS, and transistors Mp1-8 are P-type MOSFETS). Regulator 130A also includes diode D1 and switch T1.

As discussed above, in various embodiments, regulator 130A is configured to adjust the power supply voltage on rails 132A and 134A based on a comparison using the power supply voltage on rails 132A-B and the power supply voltage on rails 134A-B. In the illustrated embodiment, regulator 130A is configured to perform a comparison by converting low-side power supply voltage ($V_{DDLS}-P_{GND}$) to a current $I_{mp4}$ with resistor R2 and transistor Mp4, where $I_{mp4}=(V_{DDLS}-V_{gs}(Mp4))/R2$; note that $V_{gs}(Mp4)$ is the gate-source voltage for transistor Mp4. Regulator 130A then mirrors the current $I_{mp4}$ with transistor Mp3 (transistors Mp3 and Mp4 form a first current mirror, in the illustrated embodiment) to produce a current $I_{mp3}$, which is the same as $I_{LS}$. The mirrored current $I_{mp3}$ may be equal to $I_{mp4}$ or a scaled version of $I_{mp4}$ (e.g., by a predetermined factor) in various embodiments. In the illustrated embodiment, regulator 130A is also configured to convert the high-side power supply voltage ($V_{DDHS}-V_{out}$) to a current $I_{mp1}$ with resistor R1 and transistor Mp1, where $I_{mp1}=(V_{DDHS}-V_{out}-V_{gs}(Mp1))/R1$. Regulator 130A then mirrors the current $I_{mp1}$ with transistor Mp2 (transistors Mp1 and Mp2 form a second current mirror) to produce a current $I_{mp2}$. The current $I_{mp2}$ is mirrored with transistors Mn1 and Mn2 (which form a third current mirror) to produce $I_{HS}$. In the illustrated embodiment, regulator 130A is configured to compare $I_{LS}$ and $I_{HS}$ to determine whether to adjust the high-side power supply voltage. If R1=R2, Mp4=Mp1, Mp2=Mp3, and the voltage difference between rails 132A and 134A equals the voltage difference between rails 132B and 134B (i.e., $V_{DDLS}=V_{DDHS}-V_{out}$; $V_{out}$ is the voltage at node 112), then the current $I_{Hs}$ equals the current $I_{LS}$. If the voltage differences differ, then the current $I_{HS}$ does not equal the current $I_{LS}$.

In various embodiments, regulator 130A is configured to adjust the high-side power supply voltage by charging capacitor 136. To charge capacitor 136, regulator 130A, in one embodiment, is configured to generate the current $I_{charge}$. In the illustrated embodiment, if the currents $I_{LS}$ and $I_{HS}$ differ, any difference becomes the current $I_{error}$, which equals $I_{LS}-I_{HS}$ and charges the gate voltage of transistor Mn3. By charging and discharging the gate voltage, the current $I_{error}$ generates a current $I_{mn3}$ through transistor Mn3. The current $I_{mn3}$ is mirrored by transistor Mp6 and Mp7 to produce $I_{charge}$. In the illustrated embodiment, the regulation loop for charging capacitor 136 (i.e., the path including capacitor 136, resistors R3 and R4, and transistors 110B, Mn3, Mn4, and Mp5-7) is closed to permit charging when the voltage at node 112 is low and transistor 110B is ON. The regulation loop is open and may prevent charging capacitor 136, when the voltage at node 112 is high. In various embodiments, driver 120A is powered by a charge stored in capacitor 136 when the loop is open.

In one embodiment, switch T1 is configured to interrupt the current flow through transistors Mp5, Mn3, Mn4, and Mp6 when the voltage at output 112 is making an edge transition from a higher voltage to a lower voltage during a PWM falling edge or from a lower voltage to a higher voltage during a PWM rising edge. This interruption may decrease current consumption and further reduce disturbances to driver 120A caused by high-frequency power supply ringing, which can consequently modulate edge speed dv/dt at node 112 and thus cause THD or SNR degradation in circuit 100.

In one embodiment, diode D1 is configured to prevent reverse current flow from capacitor 136 when the voltage at node 112 is high. This prevention may help the voltage $V_{DDHS}$ to remain above the voltage $V_{PP}$.

In various embodiments, regulator 130A significantly reduces high-frequency ringing due to high $dI_{charge}/dt$ during PWM edges and parasitic inductance during fast charging of bypass capacitor 136, where the parasitic inductance consists of PCB-trace, bond-wire and capacitor-terminal inductances.

Figure 3:
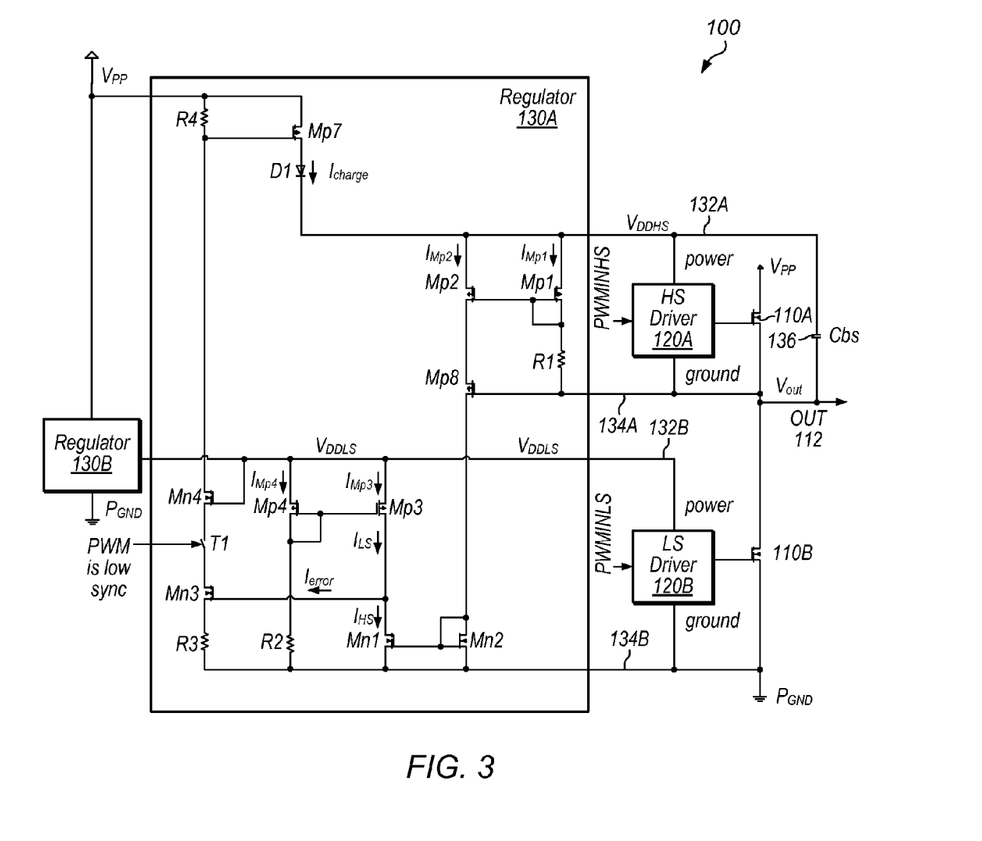
FIG. 3 is a block diagram illustrating another embodiment of a regulator that provides a power supply voltage to a gate driver.

Turning now to FIG. 3, a block diagram of another embodiment of regulator 130A is depicted. In the illustrated embodiment, regulator 130A includes resistors R1-4 and transistors Mn1-4 and Mp1-4 and Mp7-8. Regulator 130A also includes diode D1 and switch T1. In the illustrated embodiment, resistors R3 and R4 replace transistors Mp5 and Mp6, respectively. In various embodiments, resistors R1 and R2 and transistors Mn1-4, Mp1-4, and Mp7-8 may function in a similar manner as described above.

Figure 4:
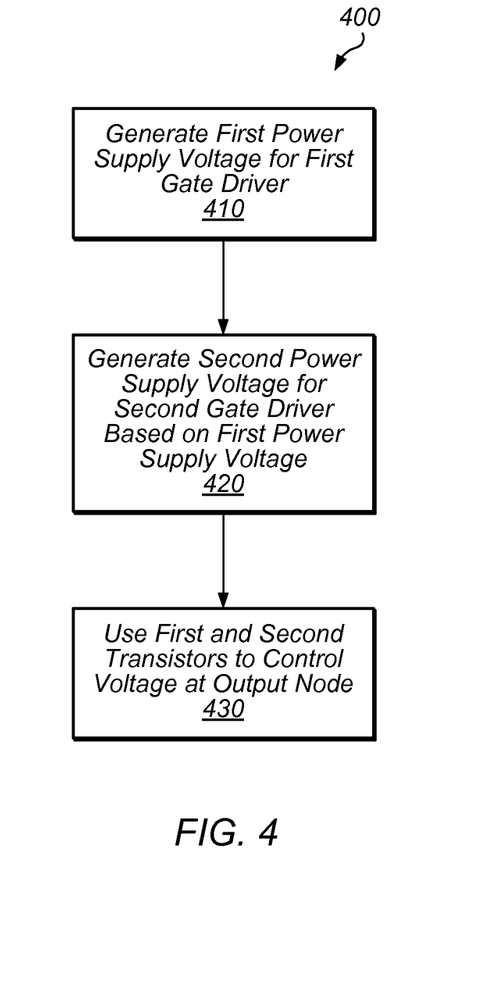
FIG. 4 is a flow diagram illustrating one embodiment of a method that may be performed by a circuit including gate drivers.

Turning now to FIG. 4, a flow diagram of a method 400 is depicted. Method 400 is one embodiment of a method that may be performed by a circuit, such as circuit 100. In some instances, performing method 400 may reduce noise that impedes circuit performance, such as high-frequency power supply ringing. In some embodiments, steps 410-430 may be performed in a different order than shown and/or concurrently.

In step 410, circuit 100 generates a first power supply voltage (e.g., via rails 132B and 134B) for a first driver (e.g., driver 120B) coupled to a gate of a first transistor (e.g., transistors 110B). In some embodiments, circuit 100 may generate the first power supply voltage by using a LS regulator (e.g., regulator 130B). In some embodiments, step 410 may include generating multiple power supply voltages with multiple regulators (e.g., regulators 130A and 130C).

In step 420, circuit 100 generates a second power supply voltage (e.g., via rails 132A and 134B) for a second driver (e.g., driver 120A) coupled to a gate of a second transistor (e.g., transistor 110A) based on the first power supply voltage generated in step 410. In some embodiments, circuit 100 generates the second power supply voltage by using a HS regulator (e.g., regulator 130A). (In some embodiments, circuit 100 uses the same regulator to generate both power supply voltages in steps 410 and 420—e.g., regulators 130A and 130B may be considered as one regulator.) In one embodiment, circuit 100 converts the first power supply voltage to a first current (e.g., using transistors Mp3 and Mp4 and resistor R2) and the second power supply voltage to a second current (e.g., using resistor R1 and transistors Mp1-3 and Mn1-2). Circuit 100 may then adjust the second power supply voltage based on a comparison (e.g., using transistor Mn3) of the first and second currents (e.g., currents $I_{LS}$ and $I_{HS}$). In one embodiment, circuit 100 increases the second power supply voltage in response to determining that the second current is less than the first current (e.g., $I_{HS}<I_{LS}$). Circuit 100 may decrease the second power supply voltage in response to determining that the second current is greater than the first current (e.g., $I_{HS} > I_{LS}$). In one embodiment, circuit 100 uses multiple current mirrors (e.g., current mirrors created by transistors Mp1 and Mp2, transistors Mn1 and Mn2, and transistors Mp3 and Mp4) to convert the first power supply voltage to the first current and the second power supply voltage to the second current.

In one embodiment, circuit 100 adjusts the second power supply voltage by charging a capacitor (e.g., capacitor 136) coupled between first and second power rails (e.g., rails 132A and 134A). In some embodiments, circuit 100 charges the capacitor when a gate voltage of a LS transistor exceeds a voltage threshold for that transistor (e.g., transistor 110B is ON) and not when the gate voltage is below the voltage threshold (e.g., transistor 110B is OFF). In some embodiments, the first power rail (e.g., rail 132A) includes a diode (e.g., diode D1) that prevents the current (e.g., current $I_{charge}$) from having a reverse current flow (e.g., back into transistor Mp7). In some embodiments, circuit 100 includes one or more transistors (e.g., transistors Mp5, Mn3, Mn4, and Mp6) that charge the capacitor and a switch (e.g., switch T1) that interrupts current flow through the one or more transistors to prevent charging of the capacitor while the voltage at the node is making an edge transition—e.g., the falling of a voltage at node during a PWM falling edge or the rising of a voltage at node during a PWM rising edge.

In step 430, circuit 100 uses the first and second transistors (e.g., transistors 110A and 110B) to control a voltage at an output node (e.g., node 112 and/or node 114). In one embodiment in which circuit 100 is (or includes) an amplifier, the output node is used to power a speaker. In one embodiment in which circuit 100 is (or includes) a DC-DC converter, the output node is used to supply a regulated DC power signal. In one embodiment in which circuit 100 is (or includes) a light-emitting diode (LED) driver, the output node is used to power one or more LEDs.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a first transistor configured to raise a voltage at a node;
    a second transistor configured to lower the voltage at the node;
    a first driver configured to receive a first power supply voltage, wherein the first driver is configured to use the first power supply voltage to control a gate voltage of the first transistor;
    a second driver configured to receive a second power supply voltage, wherein the second driver is configured to use the second power supply voltage to control a gate voltage of the second transistor; and
    a first regulator coupled to the first driver, wherein the first regulator is configured to generate the first power supply voltage based on the second power supply voltage.

2. The apparatus of claim 1, further comprising:
    a second regulator coupled to the second driver, wherein the second regulator is configured to generate the second power supply voltage;
    wherein the apparatus is a class-D amplifier, and wherein the first and second transistors are part of an H bridge configured to drive an output via the node.

3. The apparatus of claim 1, wherein the first regulator is configured to:
    convert the first power supply voltage to a first current;
    convert the second power supply voltage to a second current; and
    adjust the first power supply voltage based on a comparison of the first and second currents.

4. The apparatus of claim 3, wherein the first regulator is configured to use a first resistor and a first field effect transistor (FET) to convert the first power supply voltage to the first current, and wherein the first regulator is configured to use a second resistor and a second FET to convert the second power supply voltage to the second current.

5. The apparatus of claim 3, wherein the first regulator is configured to:
    increase the first power supply voltage in response to determining that the first current is less than the second current; and
    decrease the first power supply voltage in response to determining that the first current is greater than the second current.

6. The apparatus of claim 3, wherein the first regulator is configured to use a plurality of current mirrors to convert the first power supply voltage to the first current and the second power supply voltage to the second current.

7. The apparatus of claim 1, wherein the first regulator is configured to:
    provide the first power supply voltage to the first driver via first and second power rails; and
    adjust the first power supply voltage by charging a capacitor coupled between the first and second power rails.

8. The apparatus of claim 7, wherein the first regulator is configured to charge the capacitor when a gate voltage of the first transistor is below a voltage threshold for the first transistor and a gate voltage of the second transistor exceeds a voltage threshold for the second transistor, and wherein the first regulator is configured to not charge the capacitor when the gate voltage of the first transistor exceeds the voltage threshold for the first transistor and the gate voltage of the second transistor is below the voltage threshold for the second transistor.

9. The apparatus of claim 7, wherein the first regulator is configured to charge the capacitor by providing a current via the first power rail, and wherein the first power rail includes a diode configured to prevent the current from having a reverse current flow.

10. The apparatus of claim 7, wherein the first regulator comprises:
    one or more transistors configured to charge the capacitor; and a switch configured to interrupt current flow through the one or more transistors to prevent charging of the capacitor while the voltage at the node is making an edge transition.

11. An apparatus, comprising:

high-side and low-side gate drivers configured to control a voltage at a first node;

a low-side regulator configured to generate a first power supply voltage usable by the low-side gate driver; and a high-side regulator coupled to the low-side regulator, wherein the high-side regulator is configured to generate a second power supply voltage usable by the high-side driver based on the first power supply voltage.

12. The apparatus of claim 11, further comprising:

a buck convertor that includes the high-side and low-side gate drivers and the high-side and low-side regulators.

13. The apparatus of claim 11, wherein the high-side regulator is configured to compare the first power supply voltage with the second power supply voltage to determine whether to adjust the second power supply voltage.

14. The apparatus of claim 13, wherein the high-side regulator includes one or more current mirrors usable to compare the first power supply voltage with the second power supply voltage.

15. The apparatus of claim 13, wherein the high-side regulator is configured to charge a capacitor coupled to the high-side driver to adjust the second power supply voltage.

16. A method, comprising:

a circuit generating a first power supply voltage for a first driver coupled to a gate of a first transistor;

the circuit generating a second power supply voltage for a second driver coupled to a gate of a second transistor, wherein the second power supply voltage is generated based on the first power supply voltage such that generating the second power supply voltage includes:

the circuit comparing the first power supply voltage with the second power supply voltage; and the circuit adjusting the second power supply voltage based on the comparing; and the circuit using the first and second transistors to control a voltage at an output node.

17. The method of claim 16, wherein the comparing includes:

the circuit generating a first current from the first power supply voltage;

the circuit generating a second current from the second power supply voltage; and the circuit comparing the first and second voltage differences by comparing the first and second currents.

18. The method of claim 17, wherein the first current is generated using a current mirror, and wherein the second current is generated using a plurality of current mirrors.

19. The method of claim 16, wherein the adjusting includes charging a capacitor coupled to the second driver, and wherein the circuit charges the capacitor when a gate voltage of the first transistor exceeds a voltage threshold for the first transistor and a gate voltage of the second transistor is below a voltage threshold for the second transistor, and wherein the circuit does not charge the capacitor when the gate voltage of the first transistor is below the voltage threshold for the first transistor and the gate voltage of the second transistor exceeds the voltage threshold for the second transistor.

20. The method of claim 16, wherein the adjusting includes charging a capacitor coupled to the second driver, and wherein the circuit does not charge the capacitor during a portion of a pulse width modulation edge.

\* \* \* \* \*